(12) United States Patent
Kim et al.

(10) Patent No.: US 12,196,357 B2
(45) Date of Patent: Jan. 14, 2025

(54) DISPLAY DEVICE

(71) Applicant: LG ELECTRONICS INC., Seoul (KR)

(72) Inventors: Byunghee Kim, Seoul (KR); Seunggyu Kang, Seoul (KR); Jaeuk Ryu, Seoul (KR); Youngwook Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/038,962

(22) PCT Filed: Nov. 27, 2020

(86) PCT No.: PCT/KR2020/017122
§ 371 (c)(1),
(2) Date: May 25, 2023

(87) PCT Pub. No.: WO2022/114296
PCT Pub. Date: Jun. 2, 2022

(65) Prior Publication Data
US 2024/0003483 A1    Jan. 4, 2024

(51) Int. Cl.
*F16M 11/10* (2006.01)
*F16M 11/22* (2006.01)
*H05K 5/02* (2006.01)

(52) U.S. Cl.
CPC .......... *F16M 11/105* (2013.01); *F16M 11/22* (2013.01); *H05K 5/0234* (2013.01); *F16M 2200/022* (2013.01)

(58) Field of Classification Search
CPC ................ F16M 11/105; F16M 11/22; F16M 2200/002; H05K 5/0234
See application file for complete search history.

(56) References Cited

U.S. PATENT DOCUMENTS

| | | | |
|---|---|---|---|
| 7,766,288 B2 * | 8/2010 | Kim | F16M 11/2064 248/176.1 |
| 8,035,957 B2 * | 10/2011 | Jung | F16M 11/105 361/679.06 |
| 9,103,150 B1 * | 8/2015 | Wong | F16M 11/14 |
| 9,791,095 B2 * | 10/2017 | Chen | F16M 11/105 |

(Continued)

FOREIGN PATENT DOCUMENTS

| | | |
|---|---|---|
| KR | 1020060097961 | 9/2006 |
| KR | 1020060125099 | 12/2006 |
| KR | 1020080075651 | 8/2008 |

OTHER PUBLICATIONS

PCT International Application No. PCT/KR2020/017122, International Search Report dated Aug. 18, 2021, 5 pages.

*Primary Examiner* — Anita M King
(74) *Attorney, Agent, or Firm* — LEE, HONG, DEGERMAN, KANG & WAIMEY

(57) ABSTRACT

A display device of the present disclosure comprises: a head including a display panel; a stand for supporting the head; and a pivot assembly, which is coupled to the head and the stand and rotates the head, wherein the pivot assembly comprises: a rotary ring fixed to the head; a cam ring or middle ring coupled to the rotary ring; a center plate, which is located between the rotary ring and the cam ring or the middle ring and rotates together with the rotary ring and the cam ring or the middle ring; and a rear plate pivot-connected to the center plate.

10 Claims, 12 Drawing Sheets

(56) References Cited

U.S. PATENT DOCUMENTS

2017/0051866 A1 2/2017 Chen et al.
2020/0300407 A1 9/2020 Lee et al.
2022/0412502 A1* 12/2022 Shih .................... F16M 11/041

* cited by examiner

DISPLAY DEVICE

CROSS-REFERENCE TO RELATED APPLICATIONS

This application is the National Stage filing under 35 U.S.C. 371 of International Application No. PCT/KR2020/017122, filed on Nov. 27, 2020, the contents of which are all incorporated by reference herein in their entirety.

TECHNICAL FIELD

The present disclosure relates to a display device.

BACKGROUND ART

With the development of information society, there is an increasing demand for various types of display devices. In order to meet such demand, various display devices, such as a Liquid Crystal Display (LCD), a Plasma Display Panel (PDP), an Electro luminescent Display (ELD), a Vacuum Fluorescent Display (VFD), an Organic Light Emitting Diode (OLED), and the like, have been developed and used.

Among these devices, an LCD panel includes a thin film transistor (TFT) substrate and a color substrate that are disposed to face each other with a liquid crystal layer interposed therebetween. The LCD panel can display an image using light provided by a backlight unit. In addition, an OLED panel can display an image by depositing an organic material layer capable of emitting light by itself on a substrate on which a transparent electrode is formed.

Recently, a lot of research has been conducted on structural characteristics of a display device with a stand.

DISCLOSURE

Technical Problem

It is an objective of the present disclosure to solve the above and other problems.

It is another objective of the present disclosure to provide a rotational structure of a display device.

It is yet another objective of the present disclosure to provide a structure for controlling rotation of a display device.

Technical Solution

According to one aspect of the subject matter described in this application, a display device includes: a head including a display panel; a stand to support the head; and a pivot assembly coupled to the head and the stand, and configured to rotate the head, wherein the pivot assembly includes: a rotating ring fixed to the head; a cam ring coupled with the rotating ring; a center plate disposed between the rotating ring and the cam ring to allow the rotating ring and the cam ring to rotate together; and a rear plate pivotally connected to the center plate.

According to another aspect, a display device includes: a head including a display panel; a stand to support the head; and a pivot assembly coupled to the head and the stand, and configured to rotate the head, wherein the pivot assembly includes: a rotating ring fixed to the head; a middle ring coupled with the rotating ring; a center plate disposed between the rotating ring and the middle ring to allow the rotating ring and the middle ring to rotate together; and a rear plate pivotally connected to the center plate.

Advantageous Effects

According to at least one embodiment of the present disclosure, a rotational structure of a display device may be provided.

According to at least one embodiment of the present disclosure, a structure for controlling rotation of a display device may be provided.

Further scope of applicability of the present disclosure will become apparent from the following detailed description. However, it should be understood that the detailed description and specific embodiments such as preferred embodiments of the present disclosure are given by way of example only, since various changes and modifications within the idea and scope of the present disclosure may be clearly understood by those skilled in the art.

MODE FOR THE INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features, and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises, includes," "has," etc. specify the presence of features, numbers, steps, operations, elements, components, or combinations thereof described in the specification, but do not preclude the presence or addition of one or more other features, numbers, steps, operations, elements, components, or combinations thereof.

Figure 1:
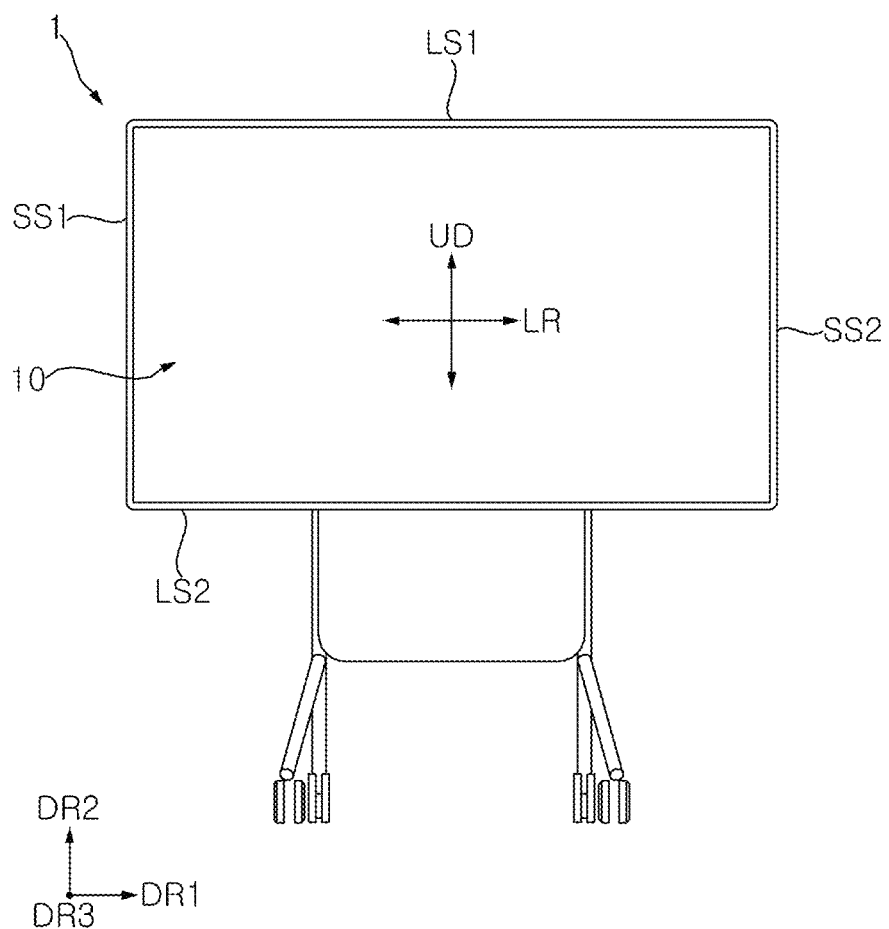
FIGS. 1 to 12 illustrate examples of a display device according to embodiments of the present disclosure.
Figure 2:
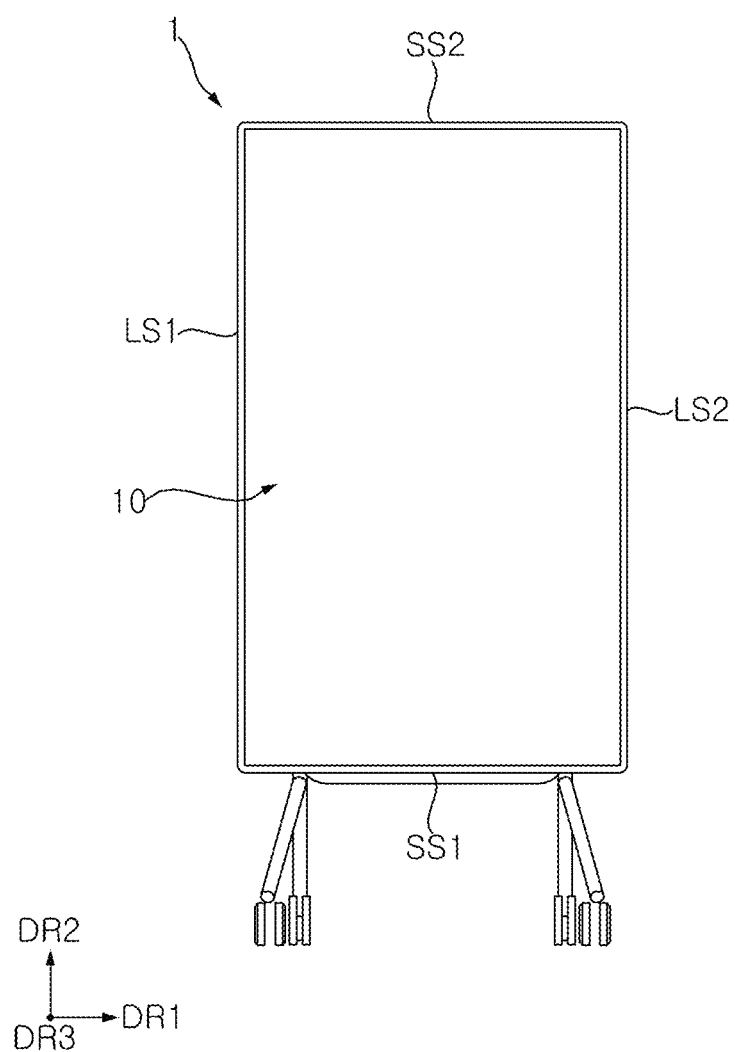

Referring to FIGS. 1 and 2, a display device 1 may include a display panel 10. The display panel 10 may display a screen.

The display device 1 may include a first long side LS1, a second long side LS2 opposite the first long side LS1, a first short side SS1 adjacent to the first long side LS1 and the second long side LS2, and a second short side SS2 opposite the first short side SS1. For the convenience of explanation, it is illustrated and described that lengths of the first and second long sides LS1 and LS2 are greater than lengths of the first and second short sides SS1 and SS2, but the lengths of the first and second long sides LS1 and LS2 may be substantially equal to the lengths of the first and second short sides SS1 and SS2.

A direction parallel to the long sides LS1 and LS2 of the display device 1 may be referred to as a first direction DR1 or a left-and-right direction LR. A direction parallel to the short sides SS1 and SS2 of the display device 1 may be referred to as a second direction DR2 or an up-and-down direction UD. A direction perpendicular to the long sides LS1 and LS2 and the short sides SS1 and SS2 of the display device 1 may be referred to as a third direction DR3 or a front-and-rear direction FR. Here, a direction in which the display panel 10 displays a screen may be referred to as a front, and a direction opposite to the front may be referred to as a rear.

When the display device 1 rotates 90 degrees (see FIG. 2), a direction parallel to the long sides LS1 and LS2 of the display device 1 may be the second direction DR2 or the up-and-down direction UD, and a direction parallel to the short sides SS1 and SS2 of the display device 1 may be the first direction DR1 or the left-and-right direction LR.

The display panel 10 may be provided on a front surface or side of the display device 1 to display an image. As each of a plurality of pixels emits light of a red, green, or blue (RGB) color in accordance with timing, the display panel 10 may display an image. The display panel 10 may be divided into an active area in which an image is displayed and a de-active area in which no image is displayed.

Figure 3:
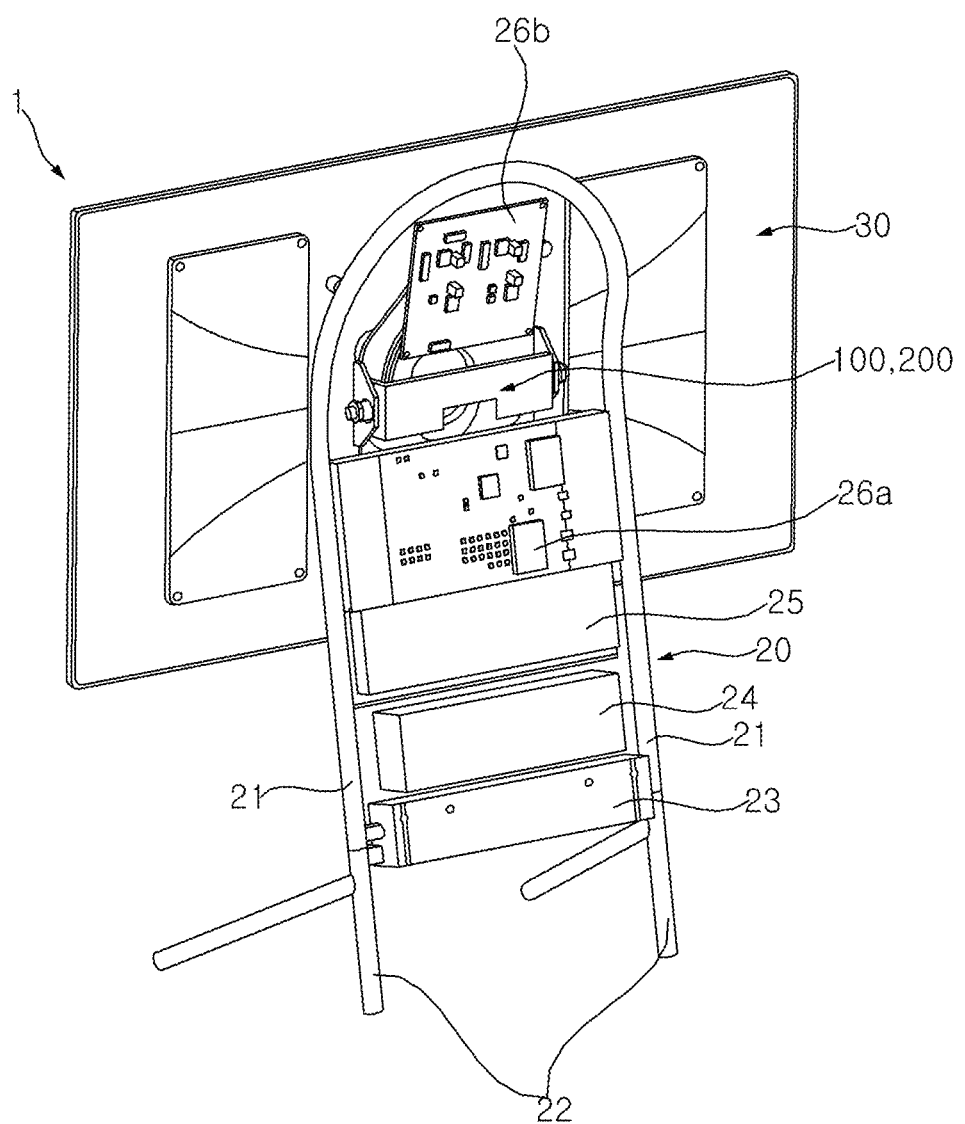

Referring to FIG. 3, a frame 30 may be disposed behind the display panel 10 to support the display panel 10. The frame 30 may contain a metal material such as an aluminum alloy or the like. The frame 30 may be referred to as a main frame or a module cover. A stand 20 may be coupled to the frame 30. A component, such as a printed circuit board (PCB) or the like, on which a plurality of electronic devices are disposed may be coupled to the stand 20.

The display panel 10 and the module cover 30 may be collectively referred to as a head (10, 30). The head (10, 30) may rotate or pivot on the stand 20. For example, the head (10, 30) may rotate or pivot 90 degrees on the stand 20. The head (10, 30) may be rotatably or pivotably coupled to the stand 20 by a pivot assembly 100. The stand 20 may be referred to as a body 20.

The stand 20 may include a stand frame 21 and a foot 22. The stand frame 21 may be a pole including a metal. The stand frame 21 may have a U-shape. A block 25 may be coupled to the stand frame 21. A first control board 26a may be mounted to the block 25, and a second control board 26b may be mounted to the pivot assembly 100. A battery 24 may be mounted to the stand frame 21 to be adjacent to the block 25. A box 23 may be coupled to the stand frame 21 to be adjacent to the battery 24. The foot 22 may be coupled to each of opposite ends of the stand frame 21 so as to support the head (10, 30) and the body 20.

Figure 4:
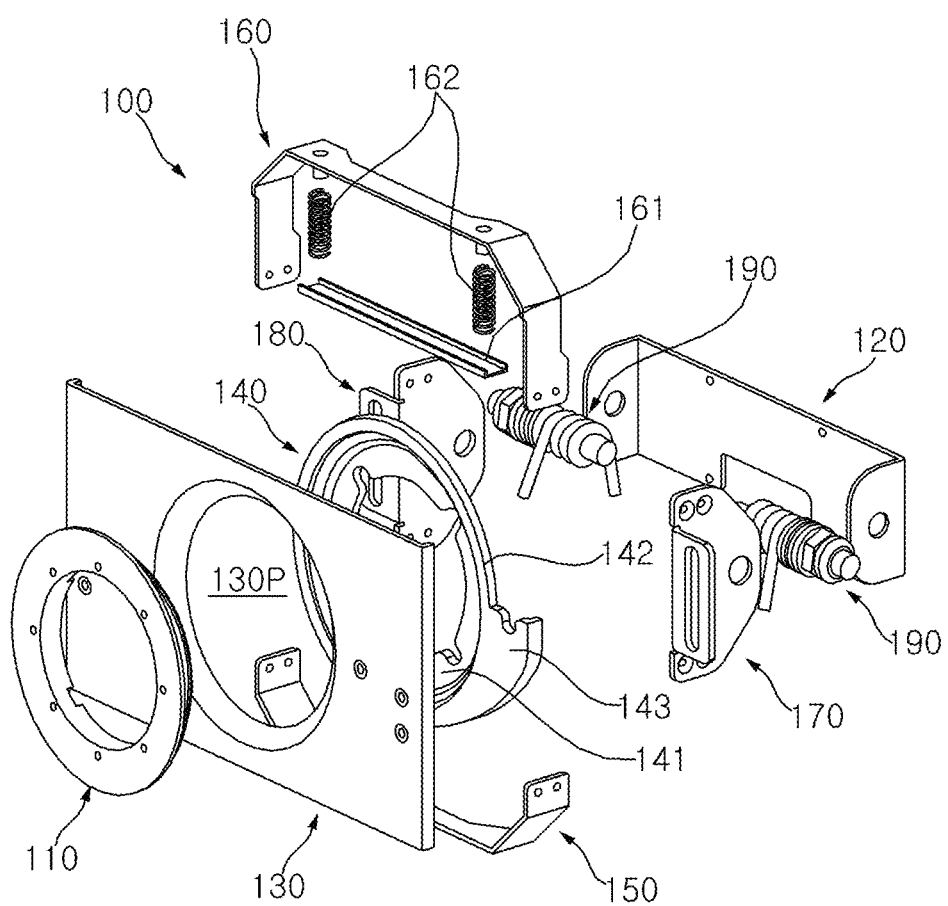

Referring to FIG. 4, a center plate 130 may include, at its center, an opening 130P of a circular shape. The center plate 130 may be pressed into the shape of a cone or funnel around the opening 130P. A rotating (or rotary) ring 110 may rotate in the opening 130P of the center plate 130. The rotating ring 110 may be inserted into the opening 130P, and may rotate in frictional contact with the center plate 130 around the opening 130P.

A cam ring 140 may be disposed opposite the rotating ring 110 with respect to the center plate 130. The cam ring 140 may be coupled with the rotating ring 110, and may rotate with respect to the center plate 130. The cam ring 140 may include an inner ring 141, an outer ring 142, and a cam 143. The inner ring 141 may be coupled with the rotating ring 110 to rotate together with the rotating ring 110. The outer ring 142 may define an outer circumferential portion of the cam ring 140. The outer ring 142 may rotate in frictional contact with the center plate 130 around the opening 130P. The center plate 130 around the opening 130P may be disposed between the rotating ring 110 and the outer ring 142 of the cam ring 140. The cam 143 may extend from the outer ring 140 in a radial direction and a circumferential direction.

A first bracket 170 may be adjacent to one side of the center plate 130 to be coupled to move up and down, and a second bracket 180 may be adjacent to another side of the center plate 130 to be coupled to move up and down. The first bracket 170 may be disposed opposite the second bracket 180 with respect to the cam ring 140. A rear plate 120 may be bent in a U-shape. A first end of the rear plate 120 may be pivotally or rotatably coupled to the first bracket 170, and a second end of the rear plate 120 may be pivotally or rotatably coupled to the second bracket 180.

An upper plate 160 may have a U-shape. A first end of the upper plate 160 may be coupled or fixed to the first bracket 170, and a second end of the upper plate 160 may be coupled or fixed to the second bracket 180. A horizontal plate 161 may be disposed between the opposite ends of the upper plate 160. Elastic members 162 may be disposed between the horizontal plate 161 and the upper plate 160. The horizontal plate 161 may come into contact from above with the cam ring 140.

A lower plate 150 may have a U-shape. A first end of the lower plate 150 may be coupled or fixed to the first bracket 170, and a second end of the lower plate 150 may be coupled or fixed to the second bracket 180.

Figure 8:
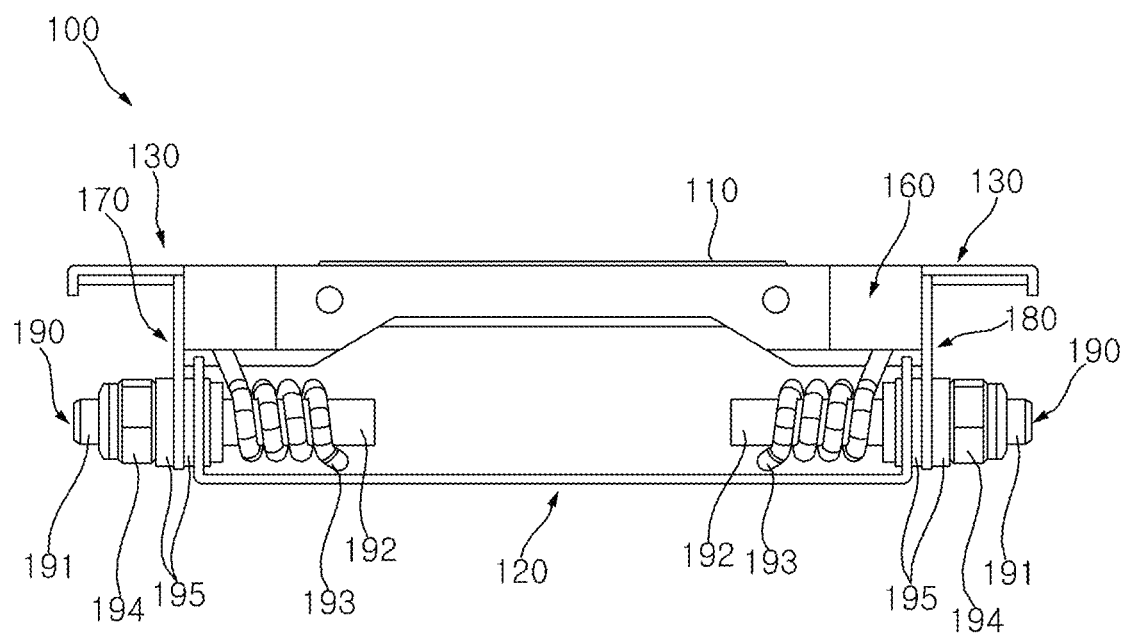

The rear plate 120 and the brackets 170 and 180 may be connected by pivot shafts 190 and elastic members 193 (see, e.g., FIG. 8). The brackets 170 and 180 and the center plate 130 may pivot with respect to the rear plate 120.

Figure 5:
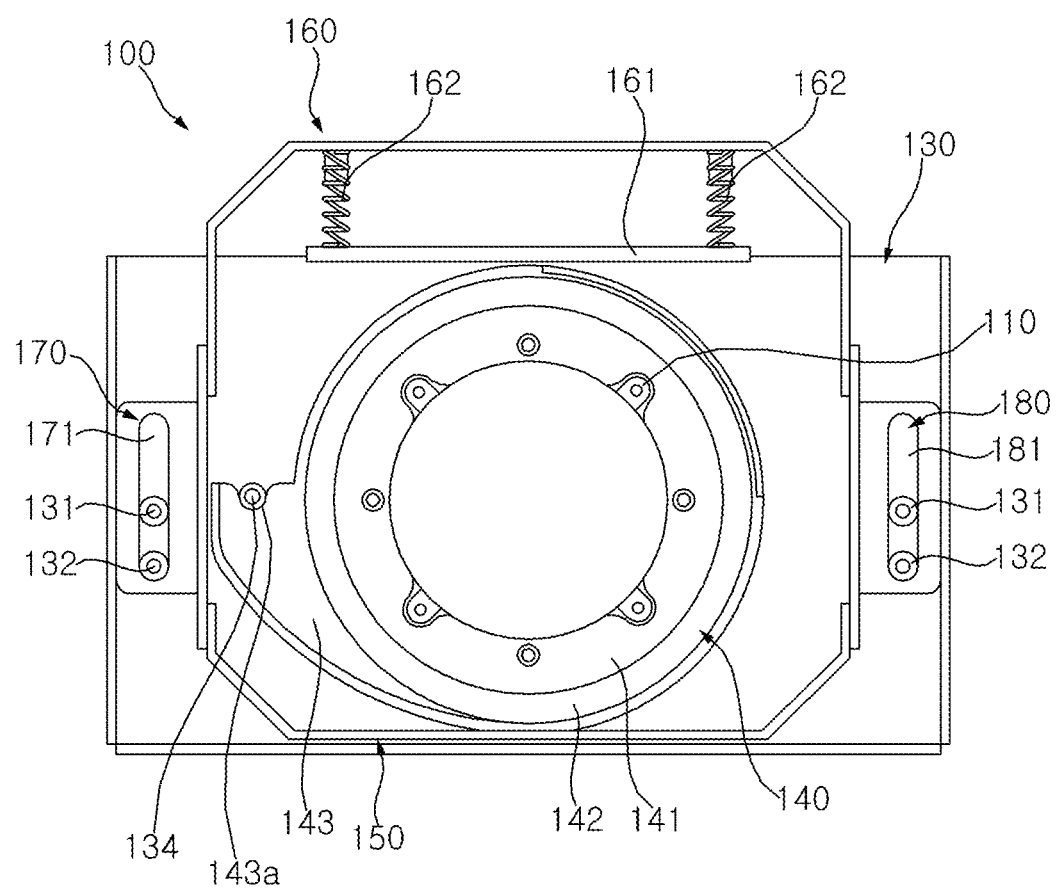
Figure 6:
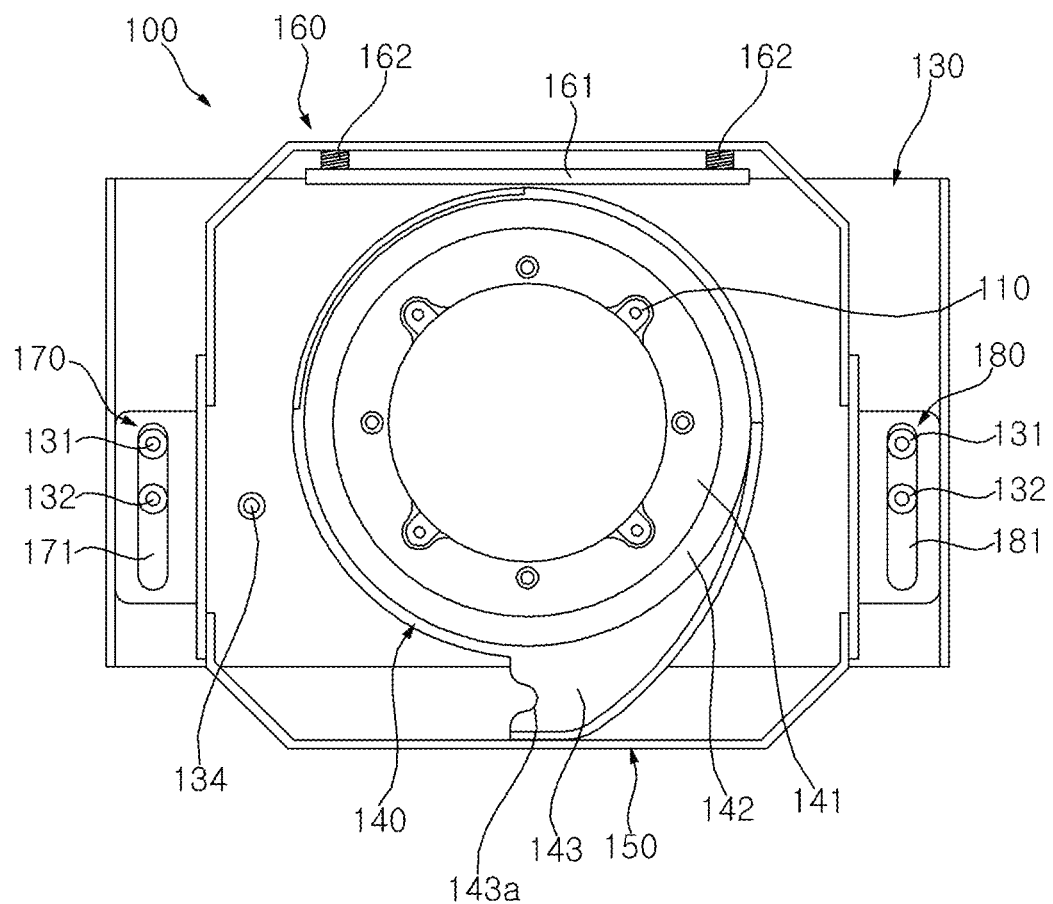

Referring to FIGS. 5 and 6, the first bracket 170 may have an elongated hole 171 in a part facing the center plate 130. The second bracket 180 may have an elongated hole 181 in a part facing the center plate 130. The center plate 130 may include PEM nuts 131 and 132, and the PEM nuts 131 and 132 may protrude from a rear surface of the center plate 130 to be fixed. The PEM nuts 131 and 132 may be inserted into the elongated hole 171, 181 to move therein.

The cam 143 may have a curvature less than a curvature of the outer ring 142. The curvature of the cam 143 may not be constant, and may gradually decrease in a direction away from the outer ring 142. An outer surface of the cam 143 may be gradually away from an outer circumferential surface of the outer ring 142 in a circumferential direction of the outer ring 142.

The cam 143 may have an insertion recess 143a. The insertion recess 143a may be formed on one side of the cam 143, and the one side of the cam 143 may be aligned in a radial direction of the outer ring 142. A stopper 134 may be disposed on the center plate 130. The stopper 134 may be positioned at 3 o'clock or 9 o'clock with respect to the outer ring 142. The stopper 134 may be inserted into the insertion recess 143a to limit or inhibit rotation of the cam ring 140.

When the cam ring 140 rotates, the insertion recess 143a of the cam 143 may be positioned at 6 o'clock with respect to the outer ring 142. Due to frictional contact with the lower plate 150, the cam 143 may be away from the lower plate 150, while being close to the upper plate 160. The horizontal plate 161 may come into contact with the cam 140, allowing the horizontal plate 161 to be close to the upper plate 160. The elastic members 162 may be compressed, which, in turn, may provide a restoring force to the cam ring 140.

Figure 7:
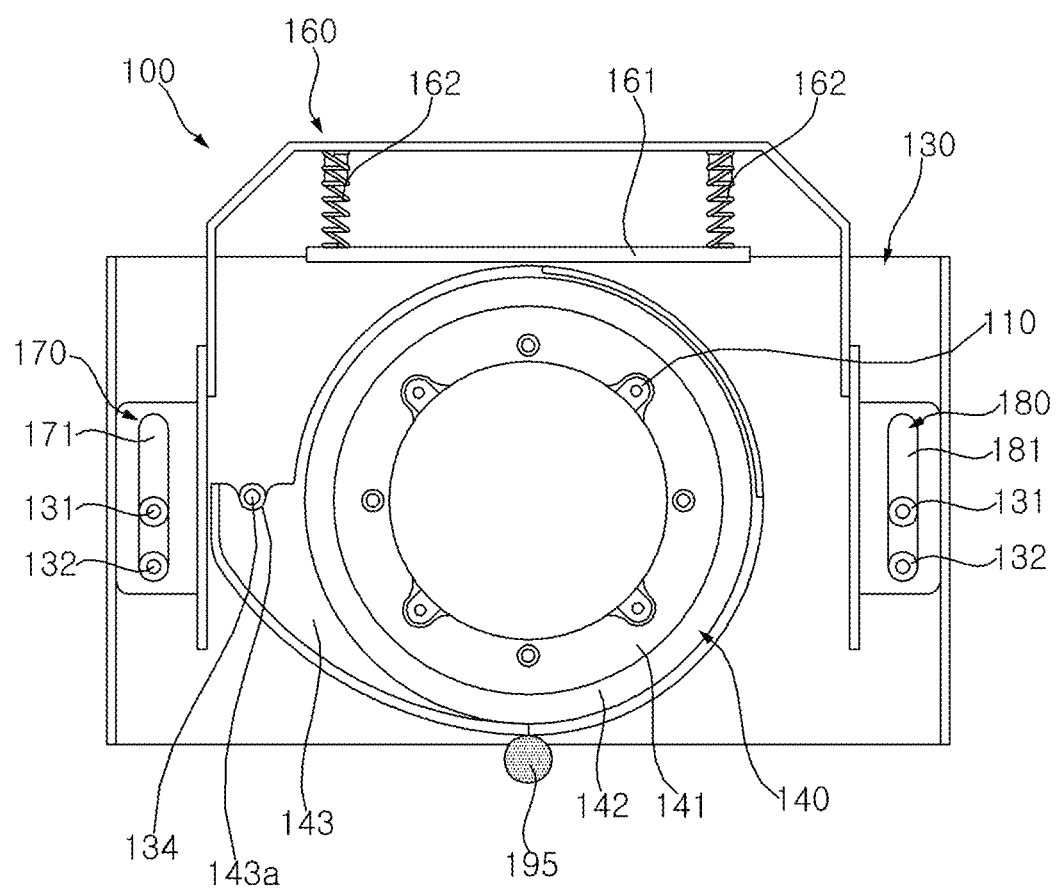

Referring to FIG. 7, the lower plate 150 described above may be omitted. A roller 195 may be disposed adjacent to a lower side of the center plate 130. The roller 195 may be fixed to the center plate 130. As the cam ring 140 rotates in contact with the roller 195, the cam ring 140 may be away from the roller 195, so that the cam ring 140 may be close to the upper plate 160.

Referring to FIG. 8, the pivot shaft 190 may include a shaft (191, 192), coupling members 194 and 195, and an elastic member 193. The shaft (191, 192) may connect the rear plate 120 and the bracket 170, 180. A first end 191 of the shaft (191, 192) may be disposed outside the rear plate 120 and the bracket 170, 180, and a second end of the shaft (191, 192) may be disposed between the rear plate 120 and the center plate 130 inside the rear plate 120.

The shaft (191, 192), the rear plate 120, and the bracket 170, 180 may be coupled to each other by the coupling members 194 and 195. For example, the coupling members 194 and 195 may be a nut 194 and/or washers 195.

The elastic member 193 may be inserted into the shaft (191, 192). For example, the elastic member 193 may be a coil spring 193. A first end of the elastic member 193 may be in contact with or supported by the rear plate 120, and a second end of the elastic member 193 may be in contact with or supported by the rear plate 120.

Figure 9:
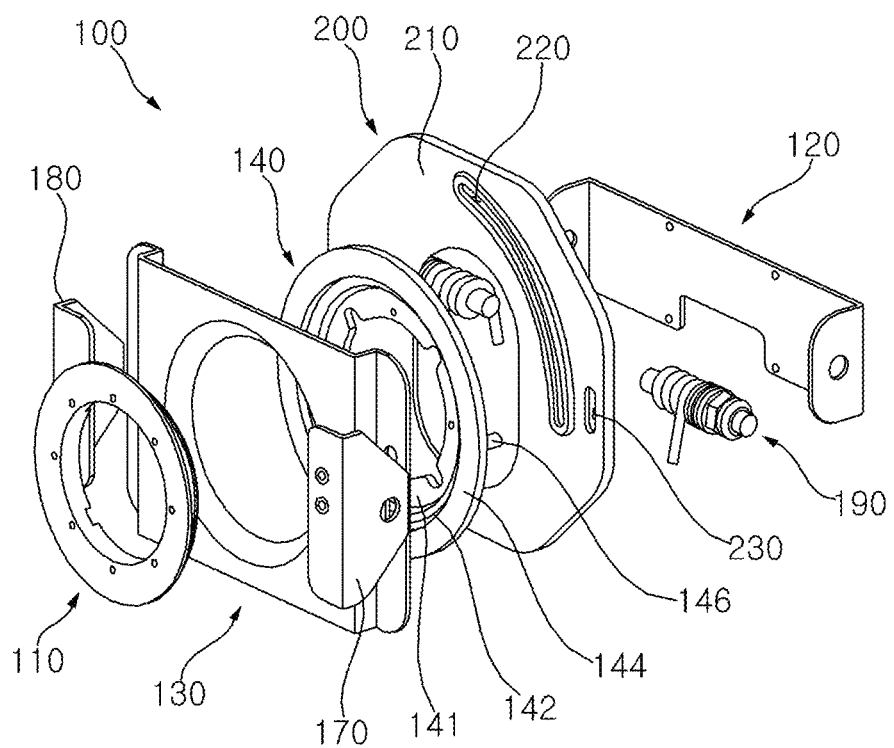

Referring to FIG. 9, a cam ring 140 may be referred to as a middle ring 140. The middle ring 140 may include an inner ring 141, an outer ring 142, and a flange 144. The flange 144 may extend from an outer circumferential surface of the outer ring 142 in a radial direction and a circumferential direction. A stopper 146 may protrude from the flange 144 toward a rear plate 120.

A middle plate 200 may be disposed between the middle ring 140 and the rear plate 120. The middle plate 200 may include a plate 210 and a guide slot 220. The guide slot 220 may be formed through the plate 210 along a circumferential direction of the middle ring 140. The guide slot 220 may have a curvature less than a curvature of the middle ring 140. As the middle ring 140 rotates, the stopper 146 may move in the guide slot 220, allowing a center plate 120 to move in the up-and-down direction with respect to the middle plate 200. For example, the guide slot 220 may have a central angle of 90 degrees. The stopper 146 of the middle ring 140 may be inserted into the guide slot 220 so as to move in the guide slot 220.

Figure 10:
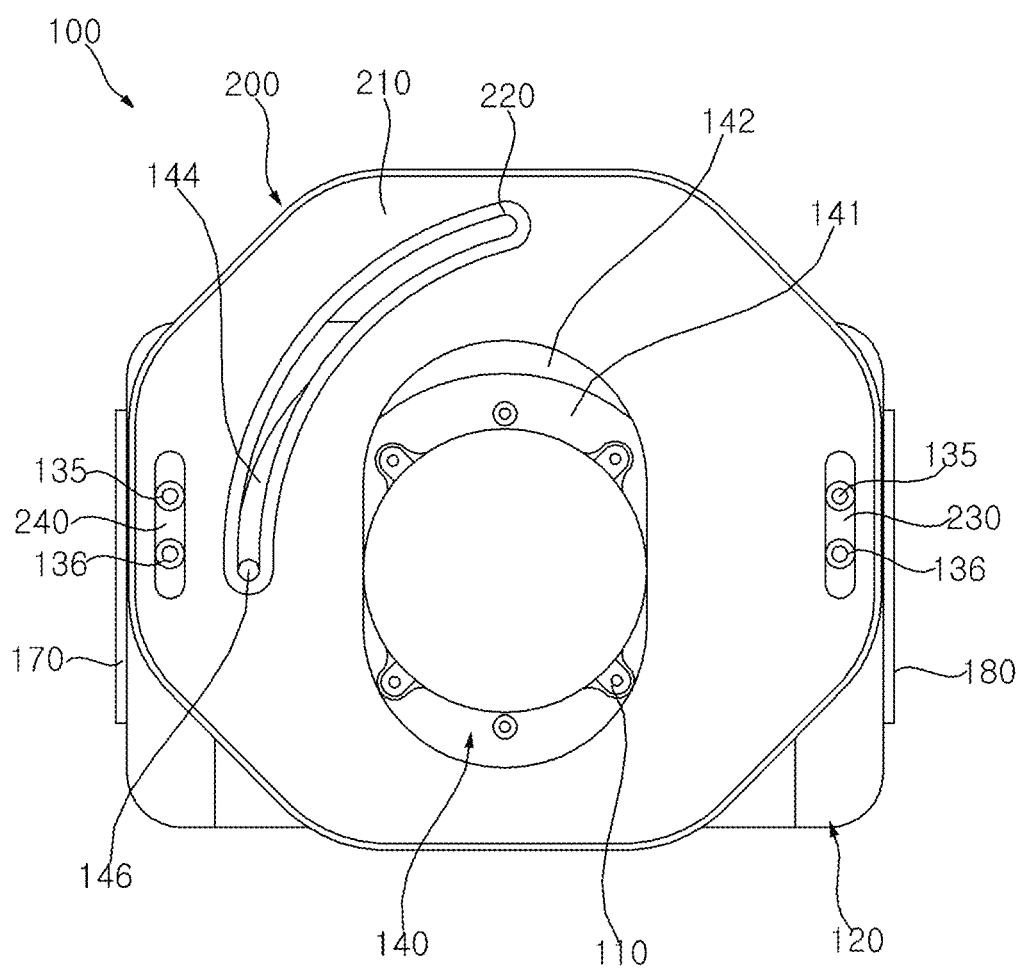
Figure 11:
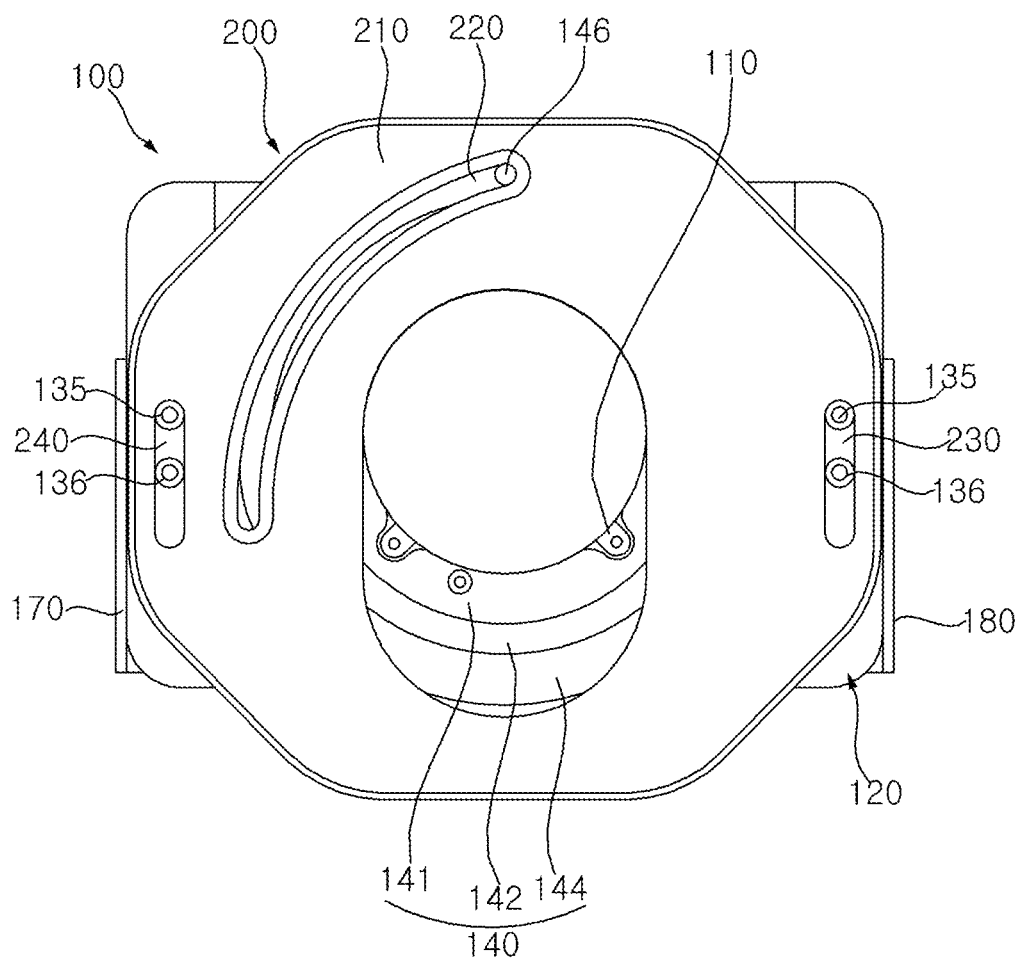

Referring to FIGS. 10 and 11, the middle plate 200 may include an elongated hole 230, 240. The elongated holes 230 and 240 may be elongated in the up-and-down direction to be respectively adjacent to opposite sides of the middle plate 200. The elongated hole 230, 240 may be formed through the plate 210 of the middle plate 200. PEM nuts 135 and 136 may be fixed to the center plate 120. The PEM nuts 135 and 136 may protrude from a rear surface of the center plate 120.

The PEM nuts 135 and 136 may be inserted into the elongated hole 135, 136 of the center plate 120 to move therein.

Figure 12:
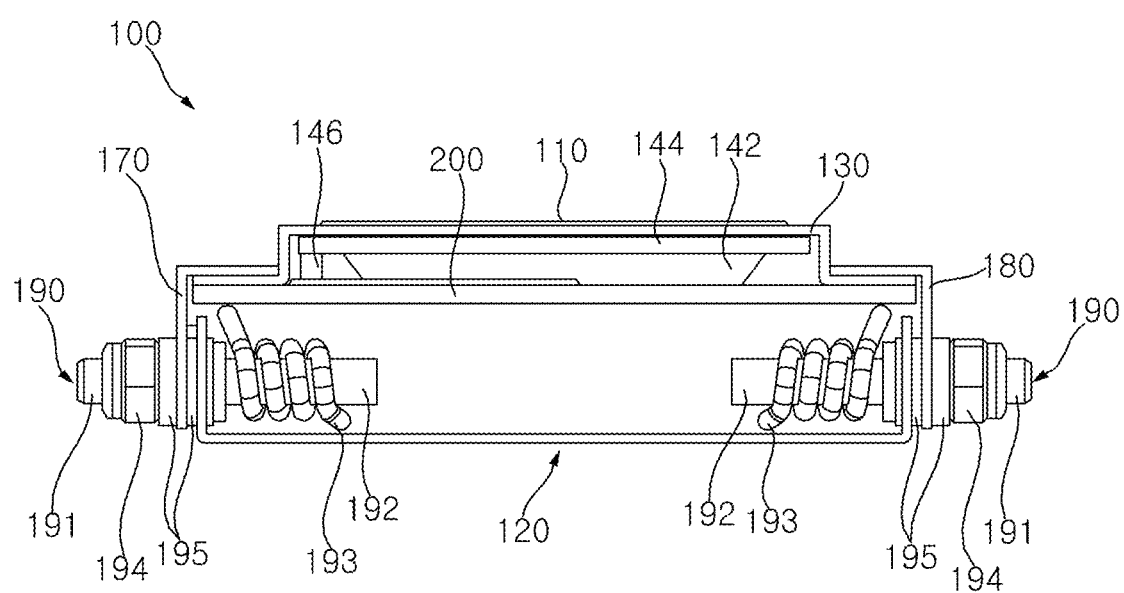

Referring to FIG. 12, a pivot shaft 190 may include a shaft (191, 192), coupling members 194 and 195, and an elastic member 193. The shaft (191, 192) may connect the rear plate 120 and a bracket 170, 180. A first end 191 of the shaft (191, 192) may be disposed outside the rear plate 120 and the bracket 170, 180, and a second end of the shaft (191, 192) may be disposed between the rear plate 120 and the center plate 130 inside the rear plate 120.

The shaft (191, 192), the rear plate 120, and the bracket 170, 180 may be coupled to each other by the coupling members 194 and 195. For example, the coupling members 194 and 195 may be a nut 194 and/or washers 195.

The elastic member 193 may be inserted into the shaft (191, 192). For example, the elastic member 193 may be a coil spring 193. A first end of the elastic member 193 may be in contact with or supported by the rear plate 120, and a second end of the elastic member 193 may be in contact with or supported by the rear plate 120.

Referring to FIGS. 1 to 12, a display device according to an aspect of the present disclosure includes: a head including a display panel; a stand to support the head; and a pivot assembly coupled to the head and the stand, and configured to rotate the head, wherein the pivot assembly includes: a rotating ring fixed to the head; a cam ring coupled with the rotating ring; a center plate disposed between the rotating ring and the cam ring to allow the rotating ring and the cam ring to rotate together; and a rear plate pivotally connected to the center plate.

According to another aspect of the present disclosure, the pivot assembly may further include at least one bracket movably coupled to the center plate, and the rear plate may be pivotally connected to the at least one bracket.

According to another aspect of the present disclosure, the pivot assembly may further include a lower plate in contact with an outer circumferential surface of the cam ring and coupled to the at least one bracket. The cam ring may include: an inner ring disposed opposite the rotating ring with respect to the center plate and coupled with the rotating ring; an outer ring extending from an outer circumferential surface of the inner ring and configured to rotate in contact with the center plate; and a cam extending from an outer circumferential surface of the outer ring in a radial direction of the outer ring and configured to come into contact with the lower plate.

According to another aspect of the present disclosure, the pivot assembly may further include: an upper plate disposed opposite the lower plate with respect to the cam ring and coupled to the at least one bracket; a horizontal plate disposed between the cam ring and the upper plate, and in contact with the outer circumferential surface of the cam ring; and an elastic member disposed between the horizontal plate and the upper plate, and supported by the horizontal plate and the upper plate.

According to another aspect of the present disclosure, the pivot assembly may further include a pivot shaft connecting the at least one bracket and the rear plate. The pivot shaft may include: a shaft formed through the at least one bracket and the rear plate; and a coil spring wound around the shaft, and having a first end supported by the center plate and a second end supported by the rear plate.

A display device according to an aspect of the present disclosure includes: a head including a display panel; a stand to support the head; and a pivot assembly coupled to the head and the stand, and configured to rotate the head, wherein the pivot assembly includes: a rotating ring fixed to the head; a middle ring coupled with the rotating ring; a center plate disposed between the rotating ring and the middle ring to allow the rotating ring and the middle ring to rotate together; and a rear plate pivotally connected to the center plate.

According to another aspect of the present disclosure, the middle ring may include: an inner ring configured to rotate together with the rotating ring; an outer ring extending from an outer circumferential surface of the inner ring and configured to rotate in contact with the center plate; a flange extending from an outer circumferential surface of the outer ring; and a stopper extending by protruding from the flange toward the rear plate.

According to another aspect of the present disclosure, the pivot assembly may further include a middle plate disposed between the middle ring and the rear plate, and coupled with the center plate to be moveable up and down with respect to the center plate. The middle plate may include a guide slot formed in the middle plate to have a curvature less than a curvature of the middle ring, and the stopper may be inserted into the guide slot to move therein.

According to another aspect of the present disclosure, the guide slot may form an arc with a central angle of 90 degrees.

According to another aspect of the present disclosure, the pivot assembly may further include at least one bracket coupled to the center plate; and a pivot shaft connecting the at least one bracket and the rear plate. The pivot shaft may include: a shaft formed through the rear plate and the at least one bracket; and a coil spring wound around the shaft. The coil spring may have a first end supported by the rear plate and a second end supported by the middle plate.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings, and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
a head comprising a display panel;
a stand to support the head; and
a pivot assembly coupled to the head and the stand, and configured to rotate the head,
wherein the pivot assembly comprises:
a rotating ring fixed to the head;
a cam ring coupled with the rotating ring;
a center plate disposed between the rotating ring and the cam ring to allow the rotating ring and the cam ring to rotate together; and
a rear plate pivotally connected to the center plate.

2. The display device of claim 1, wherein the pivot assembly further comprises at least one bracket movably coupled to the center plate, and
wherein the rear plate is pivotally connected to the at least one bracket.

3. The display device of claim 2, further comprising a lower plate in contact with an outer circumferential surface of the cam ring and coupled to the at least one bracket,
wherein the cam ring comprises:
an inner ring disposed opposite the rotating ring with respect to the center plate and coupled with the rotating ring;
an outer ring extending from an outer circumferential surface of the inner ring and configured to rotate in contact with the center plate; and
a cam extending from an outer circumferential surface of the outer ring in a radial direction of the outer ring and configured to come into contact with the lower plate.

4. The display device of claim 3, further comprising:
an upper plate disposed opposite the lower plate with respect to the cam ring and coupled to the at least one bracket;
a horizontal plate disposed between the cam ring and the upper plate, and in contact with the outer circumferential surface of the cam ring; and
an elastic member disposed between the horizontal plate and the upper plate, and supported by the horizontal plate and the upper plate.

5. The display device of claim 2, further comprising a pivot shaft connecting the at least one bracket and the rear plate,
wherein the pivot shaft comprises:
a shaft formed through the at least one bracket and the rear plate; and
a coil spring wound around the shaft, and having a first end supported by the center plate and a second end supported by the rear plate.

6. A display device comprising:
a head comprising a display panel;
a stand to support the head; and
a pivot assembly coupled to the head and the stand, and configured to rotate the head,
wherein the pivot assembly comprises:
a rotating ring fixed to the head;
a middle ring coupled with the rotating ring;
a center plate disposed between the rotating ring and the middle ring to allow the rotating ring and the middle ring to rotate together; and
a rear plate pivotally connected to the center plate.

7. The display device of claim 6, wherein the middle ring comprises:
an inner ring configured to rotate together with the rotating ring;
an outer ring extending from an outer circumferential surface of the inner ring and configured to rotate in contact with the center plate;
a flange extending from an outer circumferential surface of the outer ring; and
a stopper extending by protruding from the flange toward the rear plate.

8. The display device of claim 7, wherein the pivot assembly further comprises a middle plate disposed between the middle ring and the rear plate, and coupled with the center plate to be moveable up and down with respect to the center plate,
- wherein the middle plate comprises a guide slot formed in the middle plate to have a curvature less than a curvature of the middle ring, and
- wherein the stopper is inserted into the guide slot to move therein.

9. The display device of claim 8, wherein the guide slot forms an arc with a central angle of 90 degrees.

10. The display device of claim 8, further comprising:
- at least one bracket coupled to the center plate; and
- a pivot shaft connecting the at least one bracket and the rear plate,
- wherein the pivot shaft comprises:
- a shaft formed through the rear plate and the at least one bracket; and
- a coil spring wound around the shaft, and
- wherein the coil spring has a first end supported by the rear plate and a second end supported by the middle plate.

* * * * *